(12) United States Patent
Kalra et al.

(10) Patent No.: US 11,818,943 B2
(45) Date of Patent: Nov. 14, 2023

(54) FABRICATING ORGANIC LIGHT EMITTING DIODES (OLEDS) USING TUBULIN

(71) Applicant: Novocure GmbH, Root (CH)

(72) Inventors: Aarat Pratyaksh Kalra, Edmonton (CA); Jack Adam Tuszynski, Edmonton (CA); Sahil Deepak Patel, Edmonton (CA); Karthik Shankar, Edmonton (CA)

(73) Assignee: Novocure GmbH, Root (CH)

( * ) Notice: Subject to any disclaimer, the term of this patent is extended or adjusted under 35 U.S.C. 154(b) by 338 days.

(21) Appl. No.: 17/354,519

(22) Filed: Jun. 22, 2021

(65) Prior Publication Data

US 2021/0408383 A1    Dec. 30, 2021

Related U.S. Application Data

(60) Provisional application No. 63/043,891, filed on Jun. 25, 2020.

(51) Int. Cl.
| | |
|---|---|
| *H01L 51/00* | (2006.01) |
| *H10K 71/15* | (2023.01) |
| *H10K 50/15* | (2023.01) |
| *H10K 50/16* | (2023.01) |
| *H10K 50/18* | (2023.01) |

(52) U.S. Cl.
CPC ............ *H10K 71/15* (2023.02); *H10K 50/15* (2023.02); *H10K 50/16* (2023.02); *H10K 50/18* (2023.02)

(58) Field of Classification Search
CPC ........ H10K 71/15; H10K 50/15; H10K 50/16; H10K 50/18; H10K 85/761
See application file for complete search history.

(56) References Cited

U.S. PATENT DOCUMENTS

| | | |
|---|---|---|
| 6,868,289 B2 | 3/2005 | Palti |
| 7,016,725 B2 | 3/2006 | Palti |
| 7,089,054 B2 | 8/2006 | Palti |
| 7,136,699 B2 | 11/2006 | Palti |
| 7,146,210 B2 | 12/2006 | Palti |
| 7,333,852 B2 | 2/2008 | Palti |
| 7,467,011 B2 | 12/2008 | Palti |
| 7,519,420 B2 | 4/2009 | Palti |

(Continued)

OTHER PUBLICATIONS

Roosen-Runge et al., "Protein self-diffusion in crowded solutions," PNAS, vol. 108, No. 29, pp. 11815-11820, Jul. 2011.

(Continued)

*Primary Examiner* — Bitew A Dinke
(74) *Attorney, Agent, or Firm* — Potomac Law Group, PLLC (57) ABSTRACT

Organic light-emitting diodes are disclosed comprising an electron transport layer and a hole transport layer. At least one of the transport layers is formed by (a) dissolving tubulin or microtubules in a mixture of water and a solvent that changes the surface charge of tubulin, wherein the percentage of solvent in the mixture is selected so that the tubulin acquires a desired surface charge, and (b) using the tubulin with the desired surface charge to fabricate the at least one of the transport layers. Advantageously, the solvent may be DMSO. Methods of fabricating such organic light emitting diodes are also disclosed.

16 Claims, 7 Drawing Sheets

(56) References Cited

U.S. PATENT DOCUMENTS

| | | |
|---|---|---|
| 7,565,205 B2 | 7/2009 | Palti |
| 7,565,206 B2 | 7/2009 | Palti |
| 7,599,745 B2 | 10/2009 | Palti |
| 7,599,746 B2 | 10/2009 | Palti |
| 7,706,890 B2 | 4/2010 | Palti |
| 7,715,921 B2 | 5/2010 | Palti |
| 7,805,201 B2 | 9/2010 | Palti |
| 7,890,183 B2 | 2/2011 | Palti et al. |
| 7,912,540 B2 | 3/2011 | Palti |
| 7,917,227 B2 | 3/2011 | Palti |
| 8,019,414 B2 | 9/2011 | Palti |
| 8,027,738 B2 | 9/2011 | Palti |
| 8,170,684 B2 | 5/2012 | Palti |
| 8,175,698 B2 | 5/2012 | Palti et al. |
| 8,229,555 B2 | 7/2012 | Palti |
| 8,244,345 B2 | 8/2012 | Palti |
| 8,406,870 B2 | 3/2013 | Palti |
| 8,447,395 B2 | 5/2013 | Palti et al. |
| 8,447,396 B2 | 5/2013 | Palti et al. |
| 8,465,533 B2 | 6/2013 | Palti |
| 8,706,261 B2 | 4/2014 | Palti |
| 8,715,203 B2 | 5/2014 | Palti |
| 8,715,529 B1 * | 5/2014 | Arterburn ............... C09K 11/06 252/301.16 |
| 8,718,756 B2 | 5/2014 | Palti |
| 8,764,675 B2 | 7/2014 | Palti |
| 9,910,453 B2 | 3/2018 | Wasserman et al. |
| 10,188,851 B2 | 1/2019 | Wenger et al. |
| 10,441,776 B2 | 10/2019 | Kirson et al. |
| 10,779,875 B2 | 9/2020 | Palti et al. |
| 10,821,283 B2 | 11/2020 | Giladi et al. |
| 10,953,209 B2 | 3/2021 | Story et al. |
| 11,020,585 B2 | 6/2021 | Alon et al. |
| 2005/0209640 A1 | 9/2005 | Palti |
| 2006/0167499 A1 | 7/2006 | Palti |
| 2006/0282122 A1 | 12/2006 | Palti |
| 2007/0033660 A1 | 2/2007 | Palti |
| 2007/0225766 A1 | 9/2007 | Palti |
| 2007/0239213 A1 | 10/2007 | Palti |
| 2009/0076366 A1 | 3/2009 | Palti |
| 2011/0137229 A1 | 6/2011 | Palti et al. |
| 2012/0283726 A1 | 11/2012 | Palti |
| 2013/0178819 A1 | 7/2013 | Palti et al. |
| 2013/0178820 A1 | 7/2013 | Palti et al. |
| 2013/0184637 A1 | 7/2013 | Palti |
| 2013/0184674 A1 | 7/2013 | Palti |
| 2014/0330268 A1 | 11/2014 | Palti et al. |
| 2015/0279504 A1 * | 10/2015 | Viville ................ C08K 3/042 252/511 |
| 2017/0120041 A1 | 5/2017 | Wenger et al. |
| 2017/0215939 A1 | 8/2017 | Palti et al. |
| 2017/0281934 A1 | 10/2017 | Giladi et al. |
| 2018/0001075 A1 | 1/2018 | Kirson et al. |
| 2018/0008708 A1 | 1/2018 | Giladi et al. |
| 2018/0050200 A1 | 2/2018 | Wasserman et al. |
| 2018/0160933 A1 | 6/2018 | Urman et al. |
| 2018/0202991 A1 | 7/2018 | Giladi et al. |
| 2019/0117956 A1 | 4/2019 | Wenger et al. |
| 2019/0117963 A1 | 4/2019 | Travers et al. |
| 2019/0307781 A1 | 10/2019 | Krex et al. |
| 2019/0308016 A1 | 10/2019 | Wenger et al. |
| 2020/0001069 A1 | 1/2020 | Kirson et al. |
| 2020/0009376 A1 | 1/2020 | Chang et al. |
| 2020/0009377 A1 | 1/2020 | Chang et al. |
| 2020/0016067 A1 | 1/2020 | Gotlib et al. |
| 2020/0016399 A1 | 1/2020 | Kaynan et al. |
| 2020/0023179 A1 | 1/2020 | Bomzon et al. |
| 2020/0061360 A1 | 2/2020 | Hagemann et al. |
| 2020/0061361 A1 | 2/2020 | Hagemann et al. |
| 2020/0069937 A1 | 3/2020 | Naveh et al. |
| 2020/0078582 A1 | 3/2020 | Alon et al. |
| 2020/0108031 A1 | 4/2020 | Borst et al. |
| 2020/0114141 A1 | 4/2020 | Bomzon et al. |
| 2020/0114142 A1 | 4/2020 | Bomzon et al. |
| 2020/0121728 A1 | 4/2020 | Wardak et al. |
| 2020/0129761 A1 | 4/2020 | Bomzon et al. |
| 2020/0146586 A1 | 5/2020 | Naveh et al. |
| 2020/0155835 A1 | 5/2020 | Wasserman et al. |
| 2020/0171297 A1 | 6/2020 | Kirson et al. |
| 2020/0179512 A1 | 6/2020 | Giladi et al. |
| 2020/0219261 A1 | 7/2020 | Shamir et al. |
| 2020/0254242 A1 | 8/2020 | Chang et al. |
| 2020/0269037 A1 | 8/2020 | Hagemann et al. |
| 2020/0269041 A1 | 8/2020 | Zeevi et al. |
| 2020/0269042 A1 | 8/2020 | Giladi et al. |
| 2020/0269043 A1 | 8/2020 | Wasserman et al. |
| 2020/0306531 A1 | 10/2020 | Tran et al. |
| 2020/0330755 A1 | 10/2020 | Wasserman et al. |
| 2020/0368525 A1 | 11/2020 | Maag et al. |
| 2021/0000528 A1 | 1/2021 | Palti et al. |
| 2021/0008367 A1 | 1/2021 | Giladi et al. |
| 2021/0031031 A1 | 2/2021 | Wasserman et al. |
| 2021/0038584 A1 | 2/2021 | Voloshin-Sela |
| 2021/0060334 A1 | 3/2021 | Avraham et al. |
| 2021/0069503 A1 | 3/2021 | Tran et al. |

OTHER PUBLICATIONS

Rossini et al., "Computing pKa Values in Different Solvents by Electrostatic Transformation," J. Chem. Theory Comput., vol. 12, No. 7, pp. 3360-3369, Jun. 2016.

Rossini et al., "Empirical Conversion of pKa Values between Different Solvents and Interpretation of the Parameters: Application to Water, Acetonitrile, Dimethyl Sulfoxide, and Menthol," ACS Omega, vol. 3, pp. 1653-1662, Feb. 2018.

Sackett et al., "Tubulin Subunit Carboxyl Termil Determine Polymerization Efficiency," The Journal of Biological Chemistry, vol. 260, No. 1, Jan. 1985.

Santelices et al., "Response to Alternating Electric Fields of Tubulin Dimers and Microtubule Ensembles in Electrolytic Solutions," Scientific Reports, vol. 7, Article 9594, Aug. 2017.

Sataric et al., "A nonlinear model of iconic wave propogation along microtubules," European Biophysics Journal, vol. 38, pp. 637-647, Mar. 2009.

Sekulic et al., "Microtubule as Nanobioelectronic Nonlinear Circuit," Serbian Journal of Electrical Engineering, vol. 9, No. 1, pp. 107-119, Feb. 2012.

Sheliakina et al., "Decoupling Ionic and Electronic Currents in Melanin," Advanced Functional Materials, vol. 28, Issue 46, p. 1805514, Nov. 2018.

Sikora et al., "Molecular Motor-Powered Shuttles along Multiwalled Carbon Nanotube Tracks," Nano Letters, vol. 14, No. 2, pp. 876-881, Jan. 2014.

Stracke et al., "Analysis of the migration behaviour of single microtubules in electric fields," Biochemical and Biophysical Communications, vol. 293, Issue 1, pp. 602-609, Apr. 2002.

Tuszynski et al., "Microtubules as Sub-Cellular Memristors," Scientific Reports, vol. 10, Article 2108, Feb. 2020.

Uppalapati et al., "Microtubule Alignment and Manipulation Using AC Electrokinetics," Small, vol. 4, No. 9, pp. 1371-1381, 2008.

Vahidzadeh et al., "Melanin-based electronics: From proton conductors to photovoltaics and beyond," Biosens Bioelectron., vol. 122, pp. 127-139, Dec. 2018.

Van Den Heuvel et al., "Electrophoresis of individual microtubules in microchannels," PNAS, vol. 104, No. 19, pp. 7770-7775, May 2007.

Van Den Heuvel et al., "High Rectifying Efficiencies of Microtubule Motility on Kinesin-Coated Gold Nanostructures," Nano Letters, vol. 5, No. 6, pp. 1117-1122, May 2005.

Van Den Heuvel et al., "Molecular sorting by electrical steering of microtubules n kinesin-coated channels," Science, vol. 312, pp. 910-914, May 2006.

Waxman et al., "Induction of Polymerization of Purified Tubulin by Sulfonate Buffers," European Journal of Biochemistry, vol. 120, pp. 129-136, 1981.

Algaier et al., "The effects of dimethyl sulfoxide on the kinetics of tubulin assembly," Biochimica et Biophysica Acta, vol. 954, pp. 235-243, 1988.

(56) References Cited

OTHER PUBLICATIONS

Borisy et al., "Purification of Tubulin and Associated High Molecular Weight Proteins from Porcine Brain and Chacterization of Microtubule Assembly in vitro," Annals of the New York Academy of Sciences, vol. 253, Issue 1, pp. 107-132, Jun. 1975.
Caceres et al., "Neuronal Polarity: Demarcation, growth and commitment," Curr. Opin. Cell Biol., vol. 24, No. 4, pp. 547-553, Aug. 2012.
Cantero et al., "Actin filaments modulate electrical activity of brain microtubule protein two-dimensional sheets," Cytoskeleton, vol. 77, pp. 167-177, 2020.
Chafai et al., "Reversible and Irreversible Modulation of Tubulin Self-Assembly by Intense Nanosecond Pulsed Electric Fields," Advanced Materials, vol. 31, 2019.
Chaudhuri et al., "Label-Free Detection of Microvesicles and Proteins by the Bundling of Gliding Microtubules," Nano Letters, vol. 18, No. 1, pp. 117-123, 2018.
Del Rocio Cantero et al., "Bundles of Brain Microtubules Generate Electrical Oscillations," Scientific Reports, vol. 8, article 11899, Aug. 2018.
Del Rocio Cantero et al., "Electrical Oscillations in Two-Dimensional Microtubular Structures," Scientific Reports, vol. 6, p. 27143, Jun. 2016.
Dent et al., "The Growth Cone Cytoskeleton in Axon Outgrowth and Guidance," Cold Spring Harbor Perspectives in Biology, 3:a001800, 2011.
Deriu et al., "Anisotropic Elastic Network Modeling of Entire Microtubles," Biophysical Journal, vol. 99, p. 2190-2199, Oct. 2010.
Desai et al., "Microtubule polymerization dynamics," Annu. Rev. Cell Dev Biol., vol. 13, pp. 83-117, Nov. 1997.
Dinu et al., "Manipulation of Individual Carbon Nanotubes by Reconstructing the Intracellular Transport of a Living Cell," Advanced Materials, vol. 21, pp. 1182-1186, 2009.
Dogterom et al., "Measurement of the Force-Velocity Relation for Growing Microtubules," Science, vol. 278, pp. 856-860, Oct. 1997.
Ellis et al., "Join the crowd," Nature, vol. 425, pp. 27-28, Sep. 2003.
Fang et al., "Design and characterization of protein-quercetin bioactive nanoparticles," Journal of Nanobiotechnology, vol. 9, p. 19, 2011.
Farhana et al., "The Cooperative Motility of Microtubules on Nano-Patterned Kinesin-1 Turf," 20th Annual International Conference on Solid-State Sensors, Actuators and Microsystems & Eurosensors XXXIII, 2019.
Fischer et al., "A smart dust biosensor powered by kinesin motors," Nature Nanotechnology, vol. 4, pp. 162-166, Mar. 2009.
Fujimoto et al., "Colocalization of Quantum Dots by Reactive Molecules Carried by Motor Proteins on Polarized Microtubule Arrays," ACS Nano, vol. 7, No. 1, pp. 447-455, Dec. 2012.
Gittes et al., "Flexural Rigidity of Microtubules and Actin Filaments Measured from Thermal Fluctuations in Shape," The Journal of Cell Biology, vol. 120, No. 4, pp. 923-934, Feb. 1993.
Grishchuk, "Biophysics of Microtubule End Coupling at the Kinetochore," Centromeres and Kinechores, pp. 397-428, Aug. 2017.
Grob et al., "Parallel mapping of optical near-field interactions by molecular motor-driven quantum dots," Nature Nanotechnology, vol. 13, pp. 691-695, Apr. 2018.
Hagen et al., "Enhanced emission efficiency in organic light-emitting diodes using deoxyribonucleic acid complex as an electron blocking layer," Applied Physics Letters, vol. 88, p. 171109, Apr. 2006.
Hawkins et al., "Mechanics of microtubules," Journal of Biomechanics, vol. 43, Issue 1, pp. 23-30, Jan. 2010.
Hess et al., "A Piconewton Forcemeter Assembled from Microtubules and Kinesins," Nano Letters, vol. 2, No. 10, pp. 1113-1115, Sep. 2002.
Hiratsuka et al., "Controlling the Direction of Kinesin-Driven Microtubule Movements along Microlithographic Tracks," Biophysical Journal, vol. 81, pp. 1555-1561, Sep. 2001.

Isozaki et al., "Control of microtubule trajectory within an electric filed by altering surface charge density," Scientific Reports, vol. 5, p. 7669, Jan. 2015.
Isozaki et al., "Control of molecular shuttles by designing electrical and mechanical properties of microtubules," vol. 2, Issue 10, eaan4882, Sep. 2017.
Junker et al., "Impact of Molecular Crowding on Translational Mobility and Conformational Properties of Biological Macromolecules," J. Phys. Chem. B, vol. 123, No. 21, pp. 4477-34486, May 2019.
Kalra et al., "Behavior of alpha, beta tubulin n DMSO-containing electrolytes," Nanoscale Advances, vol. 1, pp. 3364-3371, Jan. 2019.
Kalra et al., "Investigation of the Electrical Properties of Microtubule Ensembles under Cell-Like Conditions," Nanomaterials, vol. 10, p. 265, Feb. 2020.
Kaneko et al., "Different motilities of microtubules driven by kinesin-1 and kinesin-14 motors patterned on nanopillars," Science Advances, vol. 6, eaax7413, Jan. 2020.
Keates, "Effects of glycerol on microtubule polymerization kinetics," Biochem Biophys Res. Comm., vol. 97, No. 3, pp. 1163-1169, Dec. 1980.
Kim et al., "Active Alignment of Microtubules with Electric Fields," Nano Letters, vol. 7, No. 1, pp. 211-217, 2007.
Kumar et al., "Sunlight-driven water-splitting using two-dimensional carbon based semiconductors," Journal of Materials Chemistry A, vol. 6, pp. 12876-12931, May 2018.
Kuznetsova et al., "What Macromolecular Crowding Can Do to a Protein," Intl. J. Mol. Sci., vol. 15, pp. 23090-23140, Dec. 2014.
Kvakovszky et al., "A Review of Microelectric Manufacturing Applicaitons Using DMSO-Based Chemistries," ECS Transactions, vol. 11, No. 2, pp. 227-234, 2007.
Li et al., "Transporting a Tube in a Tube," Nano Letters, vol. 14, No. 11, pp. 6160-6164, Oct. 2014.
Lin et al., "Self-Contained, Biomolecular Motor-Driven Protein Sorting and Concentrating in an Ultrasensitive Microfluidic Chip," Nano Letters, vol. 8, No. 4, pp. 1041-1046, 2008.
Liu et al., "Rationally designed mesoporous In2O3 nanofibers functionalized Pt catalysts for high-performance acetone gas sensors," Sensors and Actuators B: Chemical, vol. 298, p. 126871, Jul. 2019.
Memet et al., "Microtubules soften due to cross-sectional flattening," eLife, vol. 7, e34695, Jun. 2018.
Mershin et al., "Tubulin dipole moment, dielectric constant and quantum behavior; computer simulations, experimental results and suggestions," Biosystems, vol. 77, pp. 73-85, Nov. 2004.
Minoura et al., "Dielectric Measurement of Individual Microtubules Using the Electroorientation Method," Biophysical Journal, vol. 90, pp. 3739-3748, May 2006.
Nicolau et al., "Parallel computation with molecular-motor-propelled agents in nanofabricated networks," PNAS, vol. 113, No. 10, pp. 2591-2596, Mar. 2016.
Nogales et al., "Structure of the alpha beta tubulin dimer by electron crystallography," Nature, vol. 393, pp. 191-203, Jan. 1998.
Olmsted et al., "Characterization of microtubule assembly in porcine brain extracts by viscometry," Biochemistry, vol. 12, No. 21, pp. 4282-4289, Oct. 1973.
Ponstingl et al., "Complete amino acid sequence of alpha-tubulin from porcine brain," Proc. Natl. Acad. Sci., vol. 78, No. 5, pp. 2757-2761, May 1981.
Priel et al., "A Biopolymer Transistor: Electrical Amplification by Microtubules," Biophysical Journal, vol. 90, pp. 4639-4643, Jun. 2006.
Reuther et al., "Highly-Efficient Guiding of Motile Microtubules on Non-Topographical Motor Patterns," Nano Letters, vol. 17, pp. 5699-5705, Aug. 2017.
Rivas et al., "Macromolecular crowding in vitro, in vivo, and in between," Trends Biochem. Sci., vol. 41, No. 11, pp. 970-981, Nov. 2016.

\* cited by examiner

FABRICATING ORGANIC LIGHT EMITTING DIODES (OLEDS) USING TUBULIN

CROSS REFERENCE TO RELATED APPLICATIONS

This application claims the benefit of U.S. Provisional Application 63/043,891, filed Jun. 25, 2020, which is incorporated herein by reference in its entirety.

BACKGROUND

Tubulin is a globular protein that forms tubular polymers termed microtubules, which are crucially involved in mitosis, cell motility and neuronal development. The high mechanical strength of microtubules permits the execution of such roles, while also enabling their exploitation within several mechanically based bio-nanodevices. Electrostatically, the tubulin dimer is highly negative under physiological pH values, permitting careful control of microtubule orientation and trajectory through the application of external electric fields.

SUMMARY OF THE INVENTION

One aspect of the invention is directed to a first method of fabricating an organic light emitting diode. The first method comprises dissolving tubulin in a mixture of water and DMSO. The percentage of DMSO in the mixture is selected so that the tubulin acquires a desired surface charge. The first method further comprises using the tubulin with the desired surface charge to fabricate at least one transport layer of an organic light-emitting diode.

In some instances of the first method, the tubulin with the desired surface charge is used to fabricate an electron transport layer of the organic light-emitting diode. In some instances of the first method, the tubulin with the desired surface charge is used to fabricate a hole transport layer of the organic light-emitting diode.

Another aspect of the invention is directed to a first organic light-emitting diode. The first organic light-emitting diode comprises an electron transport layer and a hole transport layer. At least one of the transport layers is formed by (a) dissolving tubulin or microtubules in a mixture of water and DMSO. The percentage of DMSO in the mixture is selected so that the tubulin acquires a desired surface charge. The at least one of the transport layers is further formed by (b) using the tubulin with the desired surface charge to fabricate the at least one of the transport layers.

In some embodiments of the first organic light-emitting diode, the tubulin with the desired surface charge is used to fabricate the electron transport layer. In some embodiments of the first organic light-emitting diode, the tubulin with the desired surface charge is used to fabricate the hole transport layer.

In some embodiments of the first organic light-emitting diode, the electron transport layer and the hole transport layer are both implemented in a single physical layer. Some embodiments of the first organic light-emitting diode further comprise an electron blocking layer and a hole blocking layer.

Another aspect of the invention is directed to a second method of fabricating an organic light emitting diode. The second method comprises dissolving tubulin in a mixture of water and a solvent that changes the surface charge of tubulin. The percentage of solvent in the mixture is selected so that the tubulin acquires a desired surface charge. The second method further comprises using the tubulin with the desired surface charge to fabricate at least one transport layer of an organic light-emitting diode.

In some instances of the second method, the tubulin with the desired surface charge is used to fabricate an electron transport layer of the organic light-emitting diode. In some instances of the second method, the tubulin with the desired surface charge is used to fabricate a hole transport layer of the organic light-emitting diode.

Another aspect of the invention is directed to a second organic light-emitting diode. The second organic light-emitting diode comprises an electron transport layer and a hole transport layer. At least one of the transport layers is formed by (a) dissolving tubulin or microtubules in a mixture of water and a solvent that changes the surface charge of tubulin. The percentage of solvent in the mixture is selected so that the tubulin acquires a desired surface charge. The at least one of the transport layers is further formed by (b) using the tubulin with the desired surface charge to fabricate the at least one of the transport layers.

In some embodiments of the second organic light-emitting diode, the tubulin with the desired surface charge is used to fabricate the electron transport layer. In some instances of the second organic light-emitting diode, the tubulin with the desired surface charge is used to fabricate the hole transport layer.

In some embodiments of the second organic light-emitting diode, the electron transport layer and the hole transport layer are both implemented in a single physical layer. Some embodiments of the second organic light-emitting diode further comprise an electron blocking layer and a hole blocking layer.

DESCRIPTION OF THE PREFERRED EMBODIMENTS

The utilization of tubulin and microtubules within electrically based applications is limited due to the lack of understanding of tubulin behavior in DMSO (Dimethyl Sulfoxide), a key solvent used in such devices. Herein, we display successful control of tubulin surface charge in a directionally reversible manner through the addition of DMSO as a co-solvent to an aqueous buffer. Our work indicates that tubulin acquires a positive charge in the presence of >80% DMSO. When negatively charged microtubules are exposed to this environment, positively surface charged sheets and aggregates are formed. Our work hence displays the action of microtubules as solvent sensors, wherein they can alter morphology in a surface charge dependent manner. Hence, tubulin and its polymers, in addition to being mechanically robust, are also electrically tunable.

Figure 1A:
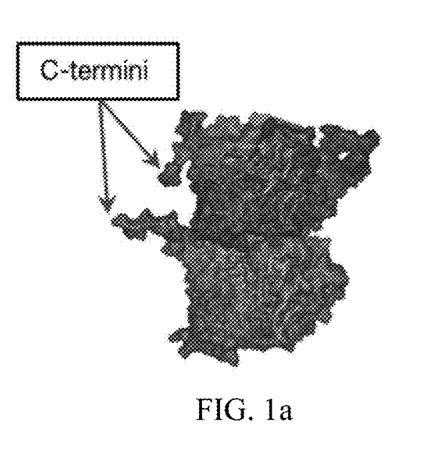
FIG. 1a illustrates the three-dimensional structure of the tubulin heterodimer.
Figure 1B:
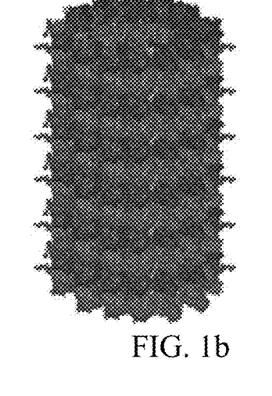
FIG. 1b is a schematic of the microtubule structure, composed of α, β tubulin dimers.
Figure 1C:
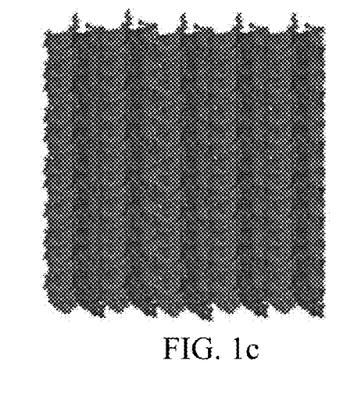
FIG. 1c is a schematic of α, β tubulin sheet structure.

Tubulin is a globular protein that forms hollow, tubular polymers termed microtubules, which play a variety of cellular roles such as providing a mechanical thrust for mitotic chromosomal segregation, serving as substrates for molecular motors that drive active macromolecular transport and working synergistically with actin filaments in neuronal growth cones to drive neurite outgrowth and migration. Microtubule mechanical properties (Young's modulus ~1 GPa; persistence length 1-10 mm) and ability to generate forces of up to 5 pN through elongating ends are key features that enable such roles, and have led to utilization within engineered nano- and microelectromechanical systems (NEMS/MEMS). In tandem with molecular motors, microtubules have been employed within high efficiency rectifiers, biosensors, direction-specific sorters and transporters, force-meters, as nanopatterning agents, and even for parallel nanocomputing. Interestingly, in addition to such mechanical roles, microtubule-based systems can also exploit the highly negative charge (47 $e^-$) that tubulin acquires at physiological pH values. The high negative charge leads to extensive counterionic condensation on the microtubule outer surface. Experiments validate that the presence of microtubules increases solution capacitance under physiologically relevant ionic conditions. When exposed to AC electric fields (in the kHz regime), these condensed counterions are modelled to mobilize, experimentally leading to frequency-specific changes in solution conductance. Notably, ~40% of the total negative tubulin charge is accumulated on the filamentous C-termini 'tails' (FIG. 1a), leading to the presence of a large protein dipole moment (~3500 D). Upon exposure to electrical nanosecond pulses, C-termini tails are modelled to undergo conformational changes that can attenuate microtubule assembly. The electrical properties of tubulin enable unprecedented control over microtubule trajectories, allowing for directed spatial migration, and full-circle electro-rotation when subjected to DC electric fields. Crucially, non-uniform electric fields can also sort microtubules in a mechanical stiffness dependent manner. While tunability of the mechanical properties of microtubules is well demonstrated, tunability of electrical properties will launch several possibilities into its application within electrically driven tubulin-based devices.

Herein, we report tunability of tubulin surface charge through the addition of DMSO as a co-solvent into aqueous buffer. We measure tubulin electrophoretic mobility (henceforth referred to simply as mobility) and Zeta potential (ZP), to find that dissolving tubulin in increasingly large DMSO volume fractions can eventually induce a positive surface charge on tubulin at >80% DMSO (v/v) solutions. Upon investigation of tubulin polymers in these solutions, we find that microtubules (which would otherwise be negatively surface charged in aqueous buffers at neutral pH values) open-up to form two-dimensional sheets and aggregates, also acquiring a net positive charge in the process. DMSO, which enhances tubulin polymerization and oligomerization, can also be used to mimic non-polar macromolecules such as lipids within the interior of the cell membrane. While the high mechanical strength of microtubules and their interesting electrical properties have allowed their utilization in several nanoscale devices, unlike other bio-nanoparticles, their utilization within OLEDs (organic light emitting diodes) and OPVs (organic photovoltaics) has heretofore not been possible due to the prevalence of DMSO as a solvent within these industries. Here, we present the first experimental study exploring the electrical properties of tubulin within DMSO and DMSO-majority solutions. In so doing, we demonstrate the utility of tubulin and its polymers within electrically based devices. Our work shows that tubulin polymers, in addition to being mechanically robust, are also electro-morphologically tunable by the addition of DMSO.

Figure 1D:
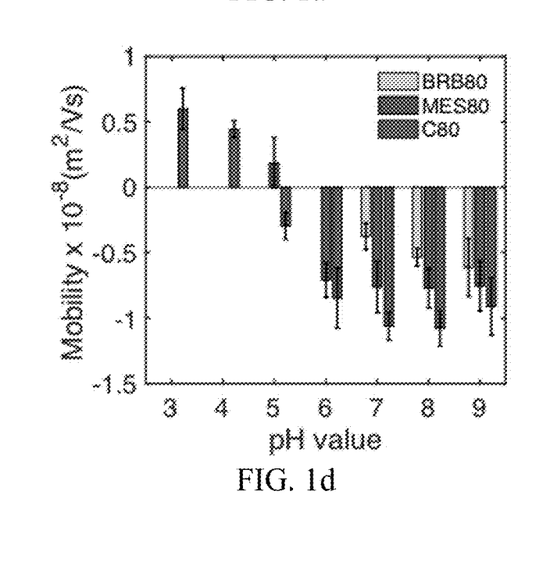
FIG. 1d illustrates the variation of mobility as a function of solution pH value.
Figure 1E:
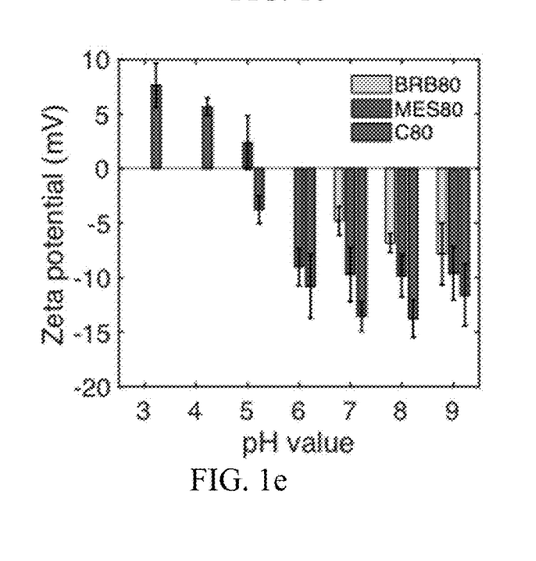
FIG. 1e illustrates the variation of ZP as a function of solution pH value.
Figure 1F:
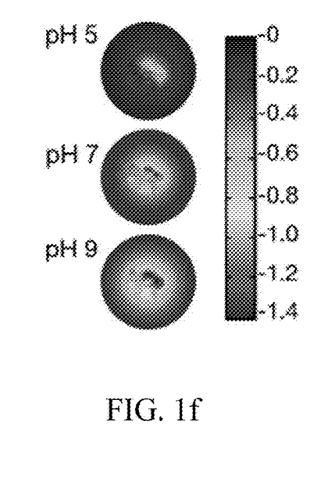
FIG. 1f illustrates a simulation of the electric potential around the tubulin dimer under varying ionic environments.

We used the two microtubule stabilization buffers BRB80 and MES80, in addition to a Citrate-KOH buffer (C80, which uses citric acid as a buffering agent), to establish the mobility and ZP of tubulin in aqueous solutions. As expected, we measured negative values for mobility and ZP of tubulin at neutral pH (FIG. 1d). Of the three buffers we tested, we found the mobility and ZP of tubulin to be highest in BRB80 (mobility=$-0.37\pm0.10\times10^{-6}$ cm/Vs, ZP=$-0.69\pm0.18$ mV), and lowest in C80 (mobility=$-1.06\pm0.10\times10^{-6}$ cm/Vs, ZP=$-13.55\pm1.37$ mV) at neutral pH. Tubulin acquired a neutral surface charge as the pH was lowered below 7, eventually becoming positive at pH<5. To investigate the electrical environment around the tubulin dimer as a function of pH value, we first predicted the structure of tubulin as a function of protonation state, subsequently using COMSOL Multiphysics 5.5 (COMSOL Inc, Burlington, Mass.) to simulate the static electric potential of tubulin (FIG. 1f). Upon closely inspecting the ZP and mobility of tubulin, we found that the isoelectric point (pI) of tubulin was slightly above 5 in MES80 and was approximately 4.5 in C80 buffer. The insolubility of PIPES (buffering agent in BRB80) at low pH values prevented its use for tubulin pI determination in BRB80. Differences in mobility and ZP are explained by tubulin conformational changes due to different buffering agents, leading it to have different surface charges in different environments. For example, tubulin dimers are possibly non-covalently crosslinked by sulfonate groups, thus PIPES (containing two sulfonate groups) is hypothesized to polymerize tubulin to a greater extent compared to MES80 (MES contains one sulfonate group).

Figure 1G:
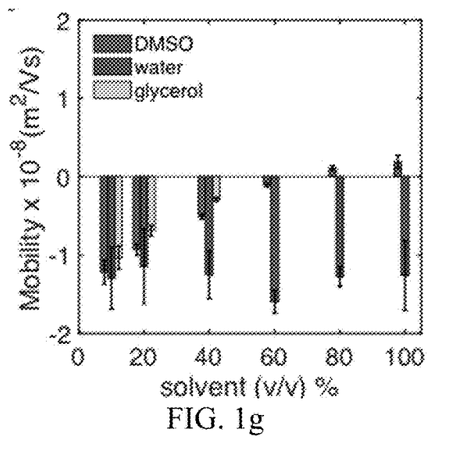
FIG. 1g illustrates the variation of mobility as a function of solvent volume fraction.
Figure 1H:
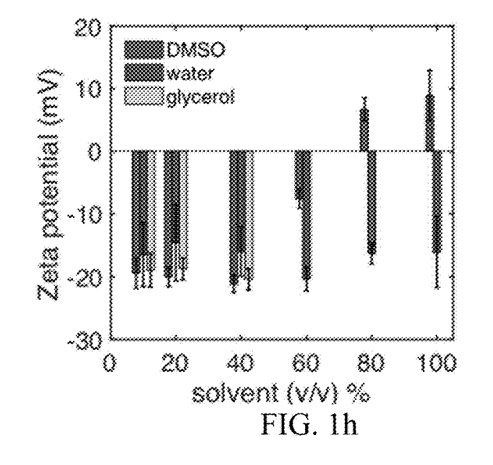
FIG. 1h is a graph displaying the variation of ZP as a function of solvent volume fraction.
Figure 1I:
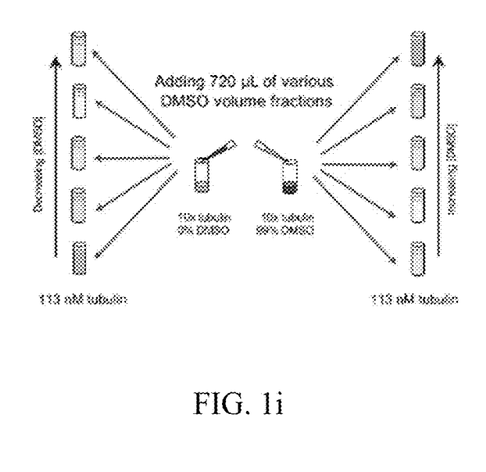
FIG. 1i illustrates the experimental procedure used to create increasing and decreasing DMSO volume fractions for probing directional reversibility.
Figure 1J:
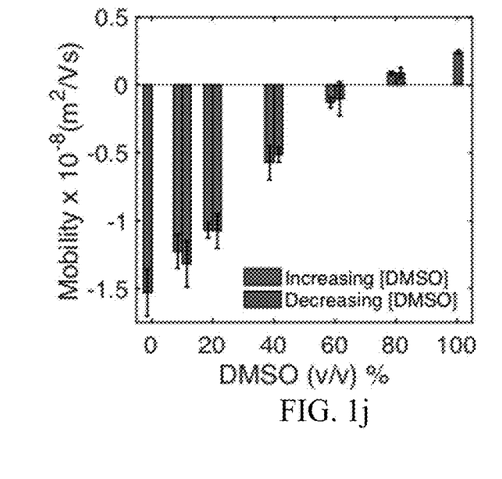
FIG. 1j is a graph displaying the variation of mobility as a function of DMSO volume fraction and dilution direction.
Figure 1K:
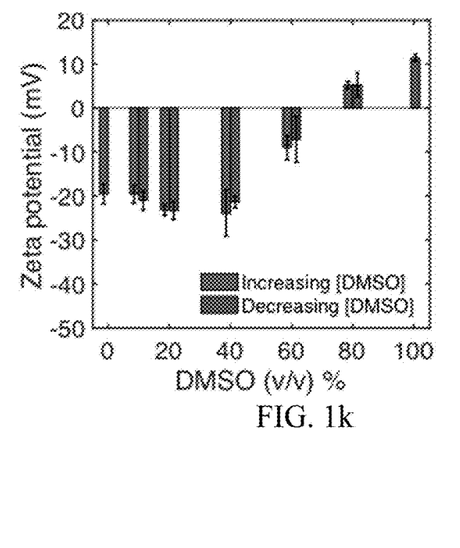
FIG. 1k is a graph displaying the variation of ZP as a function of DMSO volume fraction and dilution direction.
Figure 2A:
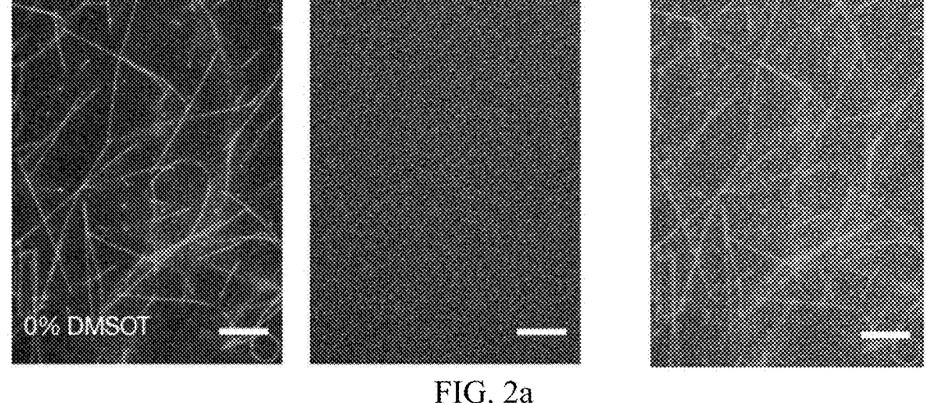
FIG. 2a illustrates microtubules (450 nM tubulin) stabilized with BRB80T (0% DMSOT).
Figure 2B:
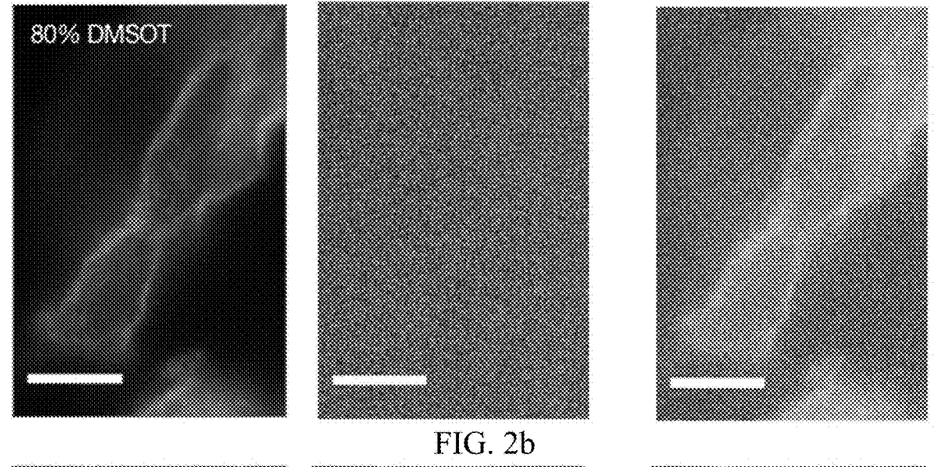
FIG. 2b illustrates microtubules (450 nM tubulin) stabilized with 80% DMSOT.
Figure 2C:
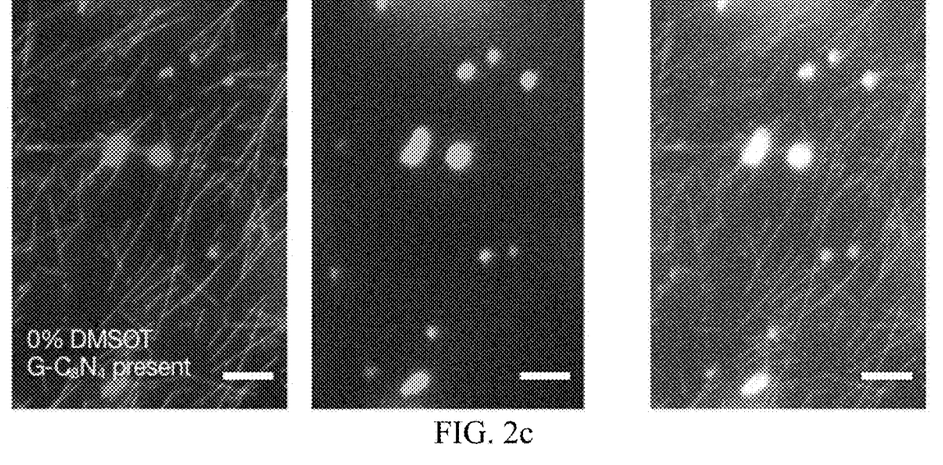
FIG. 2c illustrates microtubules (450 nM tubulin) stabilized with BRB80T (0% DMSOT), with two dimensional sheets of G-$C_3N_4$ present.
Figure 2D:
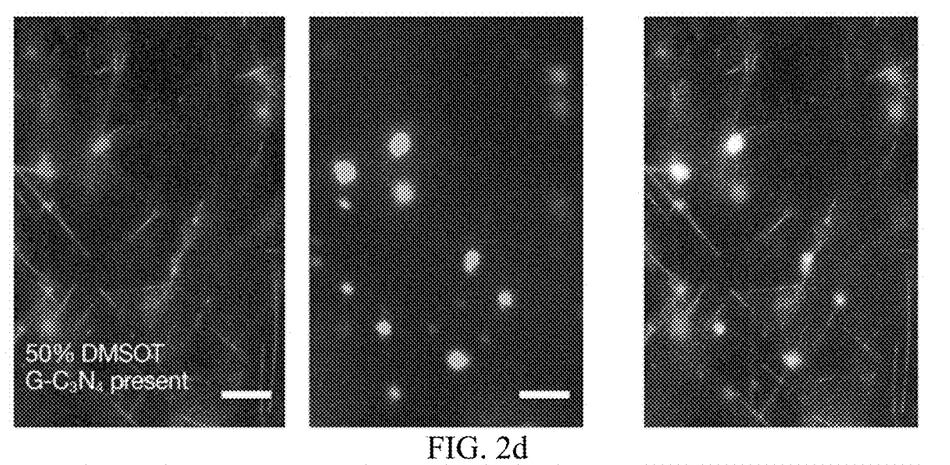
FIG. 2d illustrates microtubules (450 nM tubulin) stabilized with 50% DMSOT, with two dimensional sheets of G-$C_3N_4$ present.
Figure 2E:
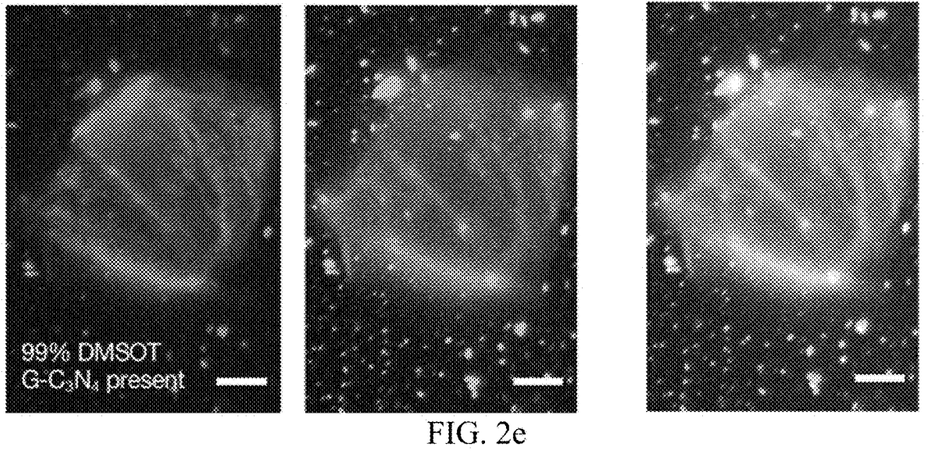
FIG. 2e illustrates microtubules (450 nM tubulin) stabilized with 99% DMSOT, with two dimensional sheets of G-$C_3N_4$ present.
Figure 2F:
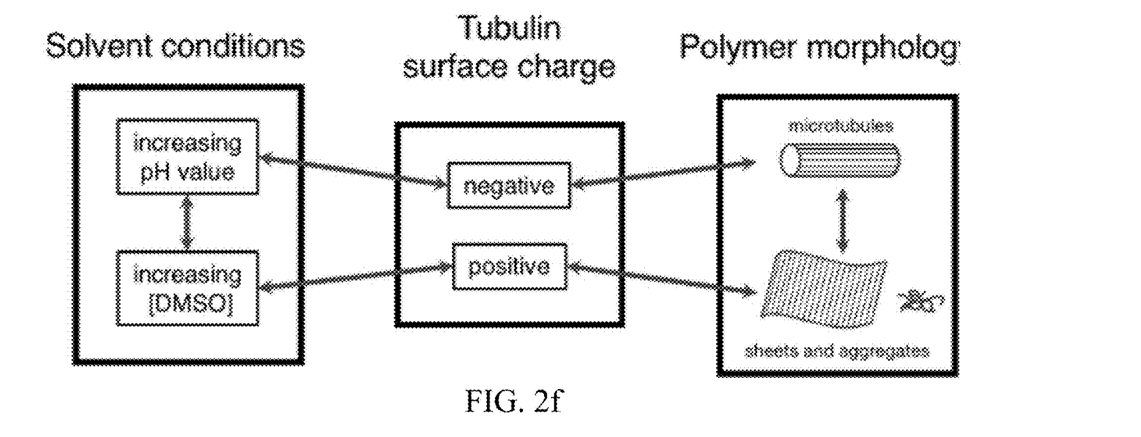
FIG. 2f is a schematic displaying the interplay between solvent conditions, tubulin surface charge and tubulin polymer morphology.
Figure 3A:
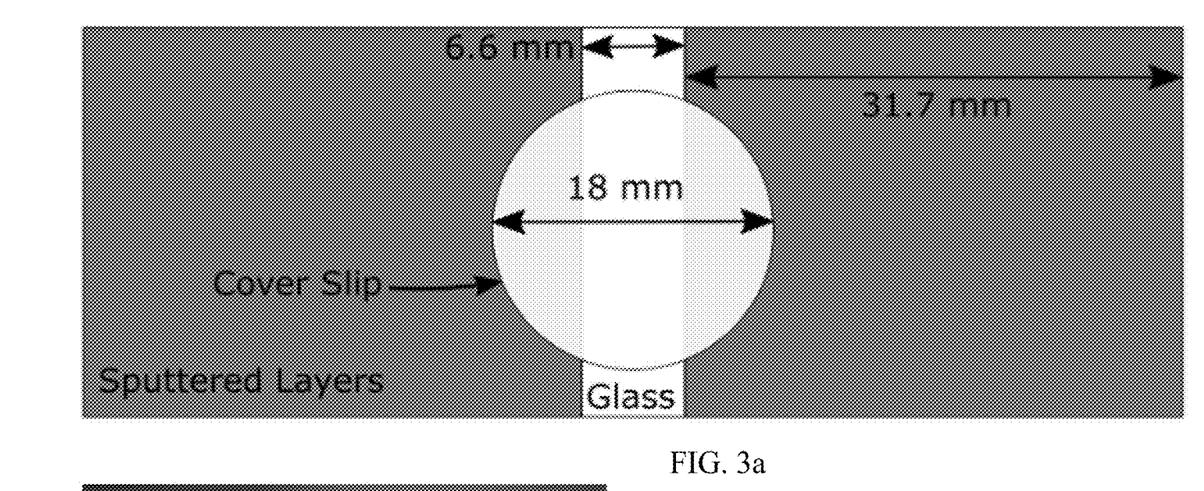
FIG. 3a is a schematic representation of the apparatus used for the electrophoretic transport assay.
Figure 3B:
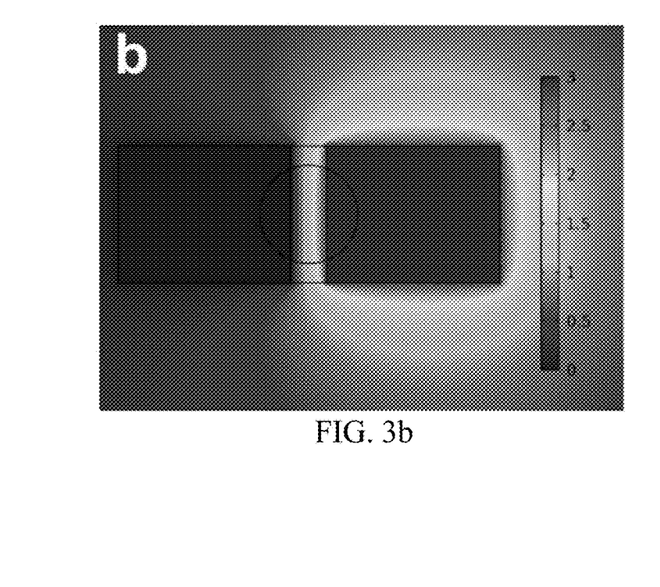
FIG. 3b illustrates the electric potential values in the plane 40 nm above the glass slide.
Figure 3C:
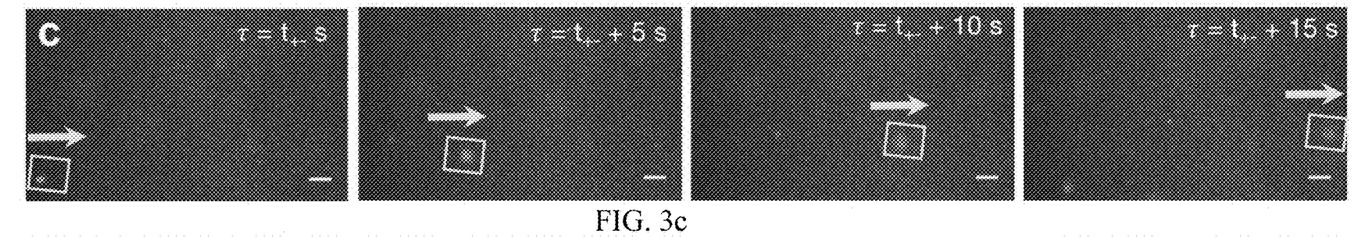
FIG. 3c illustrates an exemplary trajectory of tubulin sheets in 98% DMSOT, when exposed to 12 VDC electric field in the left to right direction.
Figure 3D:
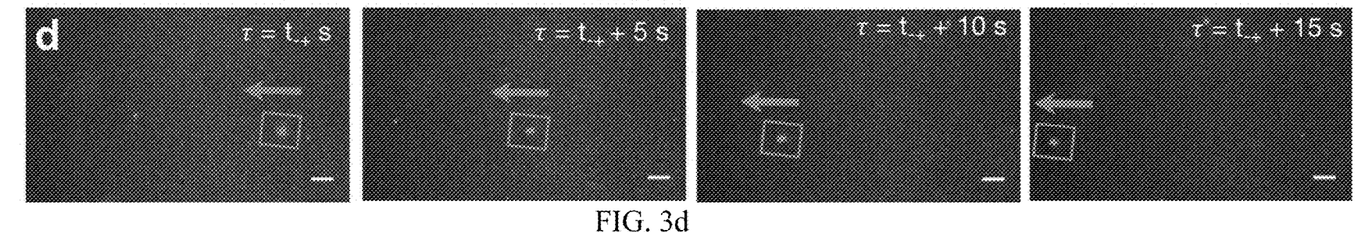
FIG. 3d illustrates an exemplary trajectory of tubulin sheets in 98% DMSOT, when exposed to 12 VDC electric field in the right to left direction.
Figure 3E:
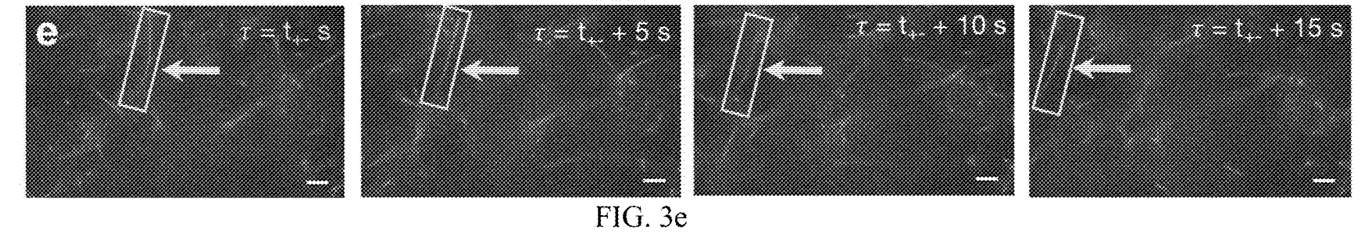
FIG. 3e illustrates an exemplary trajectory of a microtubule when exposed to 3 VDC electric field is in the left to right direction. The arrow indicates the direction of microtubule transport.
Figure 3F:
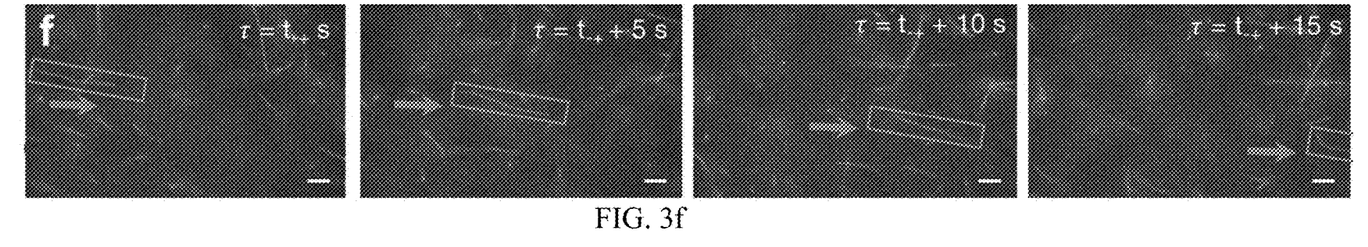
FIG. 3f illustrates an exemplary trajectory of a microtubule when exposed to 3 VDC electric field in the right to left direction.

To determine how DMSO would alter tubulin surface charge, we dissolved tubulin in various DMSO volume fractions. The mobility and ZP became less negative as the volume fraction of DMSO was increased, finally attaining a positive value (mobility at 99.7% DMSO v/v=0.18±0.08 $cm^2$ $(V\ s)^{-1}$, ZP=8.91±4.01 mV) at >80% DMSO (FIGS. 1$g$, $h$). This result indicated that tubulin surface charge could be attenuated by simply adding different volume fractions of DMSO to solution. The ability of DMSO to tune surface charge is explained by its aprotic nature and low relative permittivity, which acts to increase the pKa value of residues. This result is predicted for various chemical species and has been experimentally validated for proteins such as BSA and Lysozyme. To validate these results with tubulin, we also measured the ZP and mobility of tubulin under increasing water and glycerol volume fractions as controls. Glycerol is commonly used in polymerization 'cushion' buffers due to its stabilizing influence on microtubules, while the lowering ionic strength (altered here by increasing water volume fraction) alters microtubule growth rates, increases microtubule mobility is shown to attenuate their mechanical properties. Glycerol is also used as a crowding agent to study the effect of macromolecules that occupy up to 40% of the intracellular volume fraction. The presence of crowding agents in vitro alters the structure and dynamics of proteins, for example, significantly increasing microtubule growth and nucleation rates. In the presence of 40% glycerol, the mobility and ZP of tubulin were found to be $-0.29\pm0.02\times10^{-6}$ $cm^2$ $(V\ s)^{-1}$ and 20.39±1.69 mV respectively. Both glycerol and DMSO have similar relative permittivity values ($\varepsilon_{dmso}$=46.7, $\varepsilon_{glycerol}$=42.5), which may indicate similar influence on the mobility and ZP of tubulin. However, as the glycerol volume fraction was increased, the tubulin ZP remained unchanged with increasing glycerol volume fractions (FIG. 1$h$). Estimation of electrical properties in >50% glycerol solutions was unreliable, possibly due to the high viscosity of the solutions, limiting the ability to compare the electrical effect of glycerol and DMSO addition to tubulin solutions. As solution viscosity increased due to glycerol addition, tubulin mobility lowered as expected (FIG. 1$g$). Interestingly, the ionic strength (altered by increasing water volume fraction) was found not to influence tubulin ZP or mobility significantly (two-tailed t-test p-value of 0.851 on comparing 0% and 99% water volume fraction).

In the next experiment, to investigate if the tunability of tubulin surface charge by DMSO was directionally reversible, a 'mother liquor' solution composed of 1.13 μM tubulin dissolved in 99.9% DMSO was prepared (FIG. 1$i$). The addition of varying DMSO volume fractions to 1 μL of this solution induced a reversal to negative mobility and ZP values (FIGS. 1$j$, 1$k$). When the opposite experiment was conducted i.e. the dilution of an aqueous mother liquor (containing negatively surface charged tubulin) using higher DMSO volume fractions, tubulin acquired a positive surface charge. This experiment indicated that positively surface charged tubulin could be induced to have a negative surface charge, and vice versa. The tunability of tubulin remaining unchanged, irrespective of its solvent history, indicated the utility of tubulin as a DMSO sensor.

We next wondered what the biochemical fate of microtubules (negatively surface charged) would be, when exposed to >80% DMSO solutions. To address this question, polymerization of 1:15 Rhodamine-labelled tubulin into microtubules was performed in BRB80. Microtubules thus polymerized stabilized using either BRB80T (BRB80 supplemented with 200 μM paclitaxel) or using >80% DMSOT (DMSO supplemented with 200 μM paclitaxel). When solutions in BRB80T were imaged using epi-fluorescence microscopy, long filamentous microtubules were observed, as expected (FIG. 2$a$). However, when solutions in >80% DMSOT were imaged, a mixture of tubulin aggregates and two-dimensional tubulin sheets were observed (FIG. 2$b$). To investigate their surface charge, two-dimensional sheets of fluorine-doped graphitic carbon nitride ($G-C_3N_4$; a negatively surface charged fluorophore; Zeta potential=−26.8 mV) were introduced into tubulin polymers solutions. Interestingly, $G-C_3N_4$ sheets were found co-localized to tubulin sheets in >80% DMSOT solutions, validating their positive surface charge (FIG. 2$e$). However, microtubules in 50% DMSOT (FIGS. 2$c$, 2$d$) and in BRB80T (FIG. 2$a$), being negatively surface charged, were not found to co-localize with $G-C_3N_4$ sheets. Due to similar dimensions and the relative ease of chemically conjugating tubulin, devices where CNTs and MTs work synergistically have also been fabricated. Correspondingly, this work envisages the utility of conjugating $G-C_3N_4$ to tubulin by co-localization, allowing the regulation of the electrical properties of $G-C_3N_4$ through doping with various chemical agents (including heteroatom precursors such as $NH_4F$, thiourea, 4-(diphenylphosphino) benzoic acid (4-DPPBA) and phosphoric acid) and it would be possible to regulate the electrical properties of tubulin through C-terminal cleavage or pH changes, and their relative proximity to each other would be controlled through the addition of DMSOT. These findings appear to illustrate that when microtubules are exposed to >80% DMSOT, positively surface charged two-dimensional polymers are formed (FIG. 2$f$).

To further evaluate the sign of tubulin polymer surface charge in >80% DMSOT solutions, an electrophoretic migration assay was performed: Two groups of tubulin polymers, one in BRB80T and the other in >80% DMSOT, were separately exposed to DC electric fields of up to 24 $V\cdot cm^{-1}$ intensity using Platinum contacts (FIGS. 3$a$, 3$b$). Polymer migration en masse towards a specific contact was monitored using time-lapse epifluorescence microscopy. As expected, microtubules in BRB80T migrated towards the positively charged contact (FIG. 3$c$). However, tubulin polymers in >80% DMSOT were found to behave in the opposite manner, migrating towards the negatively charged contact, validating their positive surface charge (FIG. 3$e$). The finding was validated further when the electric field direction was reversed, i.e., the Pt contacts were oppositely polarized (FIGS. 3$d$, 3$f$).

Taken together, these results indicate the interplay between the electrostatic properties of tubulin (negative or positive surface charge) to dictate its polymeric state (microtubules or sheets). We started out by quantifying the mobility and ZP of tubulin in physiological conditions and determining its isoelectric point (pI) in aqueous buffers used for microtubule polymerization. We subsequently use a variety of assays, including electrophoretic directional transport, to confirm a 'flip' in the sign of tubulin surface charge in >80%

DMSO solutions. To our knowledge, this work is the first demonstration of the electrical tunability of tubulin using DMSO. By revealing tunability of tubulin electrostatics in DMSO, we bring this protein one step closer to utilization within the solar-cell industry, where DMSO is used as a solvent. Our experiments also reveal that alteration of the tubulin surface charge by DMSO is directionally reversible, and consistent with experimental and computational work showing that DMSO acts to increase pKa values of a chemical species. We further show that when microtubules composed of negatively charged tubulin are placed in such a chemically altered environment, they open-up to form large sheets and amorphous aggregates. Thus, we display the ability of tubulin surface charge to regulate tubulin polymer state by responding to chemical environment changes. In the future, evaluating interactions between microtubules and molecular motors in this solvent would be of great benefit in harnessing the electro-mechanical promise of these biologically ubiquitous nanowires. The integration of the microtubule-motor complex in DMSO-water mixtures would provide a fruitful method for tuning tubulin electrical properties, while simultaneously modulating its polymeric state. Our work is the first critical step in this direction.

FIGS. 1a-1k illustrate the following. 1a) The three-dimensional structure of the tubulin heterodimer, displaying the C-terminal tails. α and β subunits are shown in cyan and magenta respectively. 1b) A schematic of the microtubule structure, composed of α, β tubulin dimers. 1c) A schematic of α, β tubulin sheet structure. 1d) The variation of mobility as a function of solution pH value. 1e) The variation of ZP as a function of solution pH value. Mobility and ZP were measured using commercial equipment (Malvern Zetasizer). 1f) A simulation of the electric potential around the tubulin dimer under varying ionic environments ranging from pH 5, to pH 7, and pH 9. Simulation was performed as described using parameters extracted from Table S1. 1g) The variation of mobility as a function of solvent volume fraction. Volume fractions were measured in percent values, with the remainder consisting of MES80. 1h) Graph displaying the variation of ZP as a function of solvent volume fraction. 1i) The experimental procedure used to create increasing and decreasing DMSO volume fractions for probing directional reversibility. 1j) Graph displaying the variation of mobility as a function of DMSO volume fraction and dilution direction. 1k) Graph displaying the variation of ZP as a function of DMSO volume fraction and dilution direction.

FIGS. 2a-2f illustrate the following. 2a) Microtubules (450 nM tubulin) stabilized with BRB80T (0% DMSOT), imaged with an epi-fluorescence microscope using two channels: Magenta (excitation and emission wavelengths of 535 nm and 610 nm) and Teal (excitation and emission wavelengths of 350 nm and 460 nm). 2b) Microtubules (450 nM tubulin) stabilized with 80% DMSOT. 2c) Microtubules (450 nM tubulin) stabilized with BRB80T (0% DMSOT), with two dimensional sheets of G-$C_3N_4$ present. 2d) Microtubules (450 nM tubulin) stabilized with 50% DMSOT, with two dimensional sheets of G-$C_3N_4$ present. 2e) Microtubules (450 nM tubulin) stabilized with 99% DMSOT, with two dimensional sheets of G-$C_3N_4$ present. 2f) Schematic displaying the interplay between solvent conditions, tubulin surface charge and tubulin polymer morphology. All scale bars in FIGS. 2a-2f represent 10 µm.

FIGS. 3a-3f illustrate the following. 3a) A schematic representation of the apparatus used for the electrophoretic transport assay. 3b) The electric potential values in the plane 40 nm above the glass slide. The right side of the image displays a Pt contact pad held at 3 V, while the left side displays a grounded Pt pad. 3c) An exemplary trajectory of tubulin sheets (highlighted using a yellow box) in 98% DMSOT, when exposed to 12 VDC electric field in the left to right direction. 3d) An exemplary trajectory of tubulin sheets (highlighted using a blue box) in 98% DMSOT, when exposed to 12 VDC electric field in the right to left direction. 3e) An exemplary trajectory of a microtubule when exposed to 3 VDC electric field in the left to right direction. The arrow indicates the direction of microtubule transport. 3f) An exemplary trajectory of a microtubule (highlighted using a blue box) when exposed to 3 VDC electric field in the right to left direction. The yellow boxes represent cases where the electric field is in the left to right direction, while the blue boxes represent opposite cases All scale bars in FIGS. 3a-3f represent 10 µm.

Figure 4:
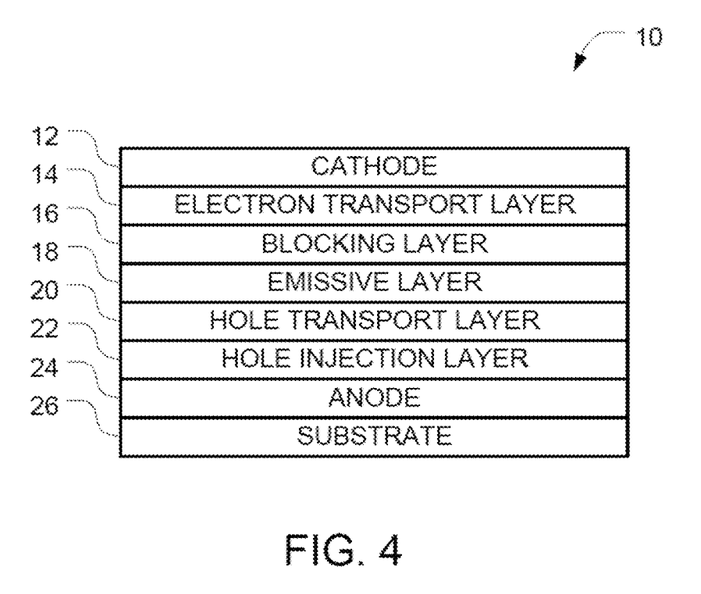
FIG. 4 is a schematic side cross section view of an organic light-emitting diode (OLED) in accordance with a preferred embodiment of the invention.

FIG. 4 is a schematic side cross section view of an organic light-emitting diode (OLED) 10 in accordance with a preferred embodiment of the invention. As shown in FIG. 4, the OLED 10 includes, from top to bottom, a cathode layer 12, an electron transport layer 14, a blocking layer 16, an emissive layer 18, a hole transport layer 20, a hole injection layer 22, an anode layer 24, and a substrate 26.

As explained above, successful control of tubulin surface charge in a directionally reversible manner can be accomplished through the addition of DMSO as a co-solvent to an aqueous buffer. For example, when dissolved in 100% buffer (v/v) solution, tubulin has a surface charge of −4.14±0.51 e; when dissolved in a mixture of 40% buffer solution and 60% DMSO, tubulin has a surface charge of −1.25±0.24 e; and when dissolved in 100% DMSO, tubulin has a positive surface charge of +1.13±0.51 e. And as explained above, tubulin acquires a positive surface charge in the presence of volume fractions greater than 80% DMSO. We can therefore give tubulin any desired surface charge (within limits) by adjusting the DMSO:water ratio of the mixture in which the tubulin is dissolved.

A typical organic light emitting diode (OLED), such as the one depicted in FIG. 4, includes an electron blocking layer, a hole blocking layer, an electron transport layer, and a hole transport layer. These layers enable electrons and holes to flow in appropriate directions in an efficient manner. The role of the electron blocking layer is to block electrons that flow in the incorrect direction, while the role of the hole blocking layer is to block holes that flow in the incorrect direction. Similarly, the role of the electron and hole transport layers is to ease the transport of electrons and holes in their respective desired direction. In principle, nanomaterials that are rich in electrons form high performance electron transport layers and hole blocking layers, Similarly, materials that are deficient in electrons form high performance electron blocking layers and hole transport layers. In some embodiments, a single physical layer can simultaneously serve as two of the layers noted above. For example, in some embodiments (not shown), the electron transport layer and the hole transport layer may both be implemented in a single physical layer.

In view of the situation described above, OLEDs can be fabricated by forming the hole transport layer (and/or electron blocking layer) using tubulin whose surface charge has been modified to have the desired positive surface charge by dissolving the tubulin in an aqueous solution of DMSO that includes a sufficient amount of DMSO. The exact ratio of DMSO that should be included in the mixture will depend on the desired surface charge for the hole transport layer. The surface charge for the hole transport layer in the OLEDs will be selected by the designer of the OLEDs in order to provide the OLEDs with the desired characteristics, as will be appreciated by persons skilled in the art of designing OLEDs.

Alternatively or additionally, OLEDs can be fabricated by forming the electron transport layer (and/or hole blocking layer) using tubulin whose surface charge has been modified to have the desired negative surface charge by dissolving the tubulin in an aqueous solution of DMSO that includes less than 80% DMSO. The exact ratio of DMSO that should be included in the mixture will depend on the desired surface charge for the electron transport layer. The surface charge for the electron transport layer in the OLEDs will be selected by the designer of the OLEDs in order to provide the OLEDs with the desired characteristics, as will be appreciated by persons skilled in the art of designing OLEDs.

Note that the shape of the polymer that is formed will depend on the surface charge of the tubulin that is used to form the polymer. For example, when the tubulin is dissolved in an aqueous buffer and has a negative surface charge, the polymer that is formed will be a microtubule, which has a cylindrical morphology. When the tubulin is modified to have a positive surface charge (e.g., when dissolved in an aqueous solution that includes at least 80% DMSO), the polymer that is formed will have a sheet structure. Thus, not only can the surface charge of the tubulin be adjusted, but the shape of the resulting polymer can also be adjusted.

Persons skilled in OLED fabrication and design can make use of this property by adjusting the relative ratios of DMSO and water to be included in the mixture in order to obtain a polymer that has a desired shape. Note that in the context of designing OLEDs, the desirability of any given shape with respect to other shapes is apparent to persons skilled in the nanodevice fabrication arts.

Finally, other solvents that change the surface charge of tubulin can be utilized instead of DMSO. Examples include organic solvents such as DMF (Dimethylformamide), chlorobenzene, and THF (tetrahydrofuran).

While the present invention has been disclosed with reference to certain embodiments, numerous modifications, alterations, and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A method of fabricating an organic light emitting diode comprising:
    dissolving tubulin in a mixture of water and DMSO, wherein the percentage of DMSO in the mixture is selected so that the tubulin acquires a desired surface charge; and
    using the tubulin with the desired surface charge to fabricate at least one transport layer of an organic light-emitting diode.

2. The method of claim 1, wherein the tubulin with the desired surface charge is used to fabricate an electron transport layer of the organic light-emitting diode.

3. The method of claim 1, wherein the tubulin with the desired surface charge is used to fabricate a hole transport layer of the organic light-emitting diode.

4. A method of fabricating an organic light emitting diode comprising:
    dissolving tubulin in a mixture of water and a solvent that changes the surface charge of tubulin, wherein the percentage of solvent in the mixture is selected so that the tubulin acquires a desired surface charge; and
    using the tubulin with the desired surface charge to fabricate at least one transport layer of an organic light-emitting diode.

5. The method of claim 4, wherein the tubulin with the desired surface charge is used to fabricate an electron transport layer of the organic light-emitting diode.

6. The method of claim 4, wherein the tubulin with the desired surface charge is used to fabricate a hole transport layer of the organic light-emitting diode.

7. An organic light-emitting diode comprising:
    an electron transport layer; and
    a hole transport layer,
    wherein at least one of the transport layers is formed by (a) dissolving tubulin or microtubules in a mixture of water and a solvent that changes the surface charge of tubulin, wherein the percentage of solvent in the mixture is selected so that the tubulin acquires a desired surface charge, and (b) using the tubulin with the desired surface charge to fabricate the at least one of the transport layers.

8. The organic light-emitting diode of claim 7, wherein the tubulin with the desired surface charge is used to fabricate the electron transport layer.

9. The organic light-emitting diode of claim 7, wherein the tubulin with the desired surface charge is used to fabricate the hole transport layer.

10. The organic light-emitting diode of claim 7, wherein the electron transport layer and the hole transport layer are both implemented in a single physical layer.

11. The organic light-emitting diode of claim 7, further comprising:
    an electron blocking layer; and
    a hole blocking layer.

12. The organic light-emitting diode of claim 7, wherein the solvent is DMSO.

13. The organic light-emitting diode of claim 12, wherein the tubulin with the desired surface charge is used to fabricate the electron transport layer.

14. The organic light-emitting diode of claim 12, wherein the tubulin with the desired surface charge is used to fabricate the hole transport layer.

15. The organic light-emitting diode of claim 12, wherein the electron transport layer and the hole transport layer are both implemented in a single physical layer.

16. The organic light-emitting diode of claim 12, further comprising:
    an electron blocking layer; and
    a hole blocking layer.

* * * * *